United States Patent [19]
Bowers et al.

[11] Patent Number: 5,648,735
[45] Date of Patent: Jul. 15, 1997

[54] COMPARATOR WITH A PREDETERMINED OUTPUT STATE IN DROPOUT

[75] Inventors: Derek F. Bowers, Sunnyvale; James J. Ashe, Saratoga, both of Calif.

[73] Assignee: Analog Devices, Inc., Norwood, Mass.

[21] Appl. No.: 636,719

[22] Filed: Apr. 23, 1996

[51] Int. Cl.$^6$ .............................. H03K 5/22; H03L 5/00
[52] U.S. Cl. .................... 327/65; 327/307; 327/563
[58] Field of Search ........................ 327/63, 65–68, 327/77–79, 87, 88, 89, 307, 560–563; 330/252, 253; 326/56, 57, 58

[56] References Cited

U.S. PATENT DOCUMENTS

| | | | |
|---|---|---|---|
| 4,272,728 | 6/1981 | Wittlinger | 330/253 |
| 4,336,502 | 6/1982 | Goto | 330/253 |
| 4,587,444 | 5/1986 | Emori et al. | 327/65 |
| 5,047,665 | 9/1991 | Burt | 330/253 |
| 5,530,444 | 6/1996 | Tice et al. | 330/252 |

OTHER PUBLICATIONS

Paul Horowitz, Winfield Hill, *The Art of Electronics*, Cambridge University Press, New York, 1989, pp. 229–231, 355–368.

*Primary Examiner*—Toan Tran
*Attorney, Agent, or Firm*—Koppel & Jacobs

[57] ABSTRACT

A comparator combines unbalanced differential input amplifiers to produce a balanced input stage that forces the comparator output to a predetermined state whenever the first differential amplifier enters dropout. The comparator's second differential amplifier is imbalanced to overcome the variable offset voltage which creates the comparator's hysteresis voltage. Its first differential amplifier is imbalanced to compensate for the imbalance of the second amplifier, thereby producing an input stage which is balanced overall and free of input offset voltages that would otherwise be present.

19 Claims, 4 Drawing Sheets

COMPARATOR WITH A PREDETERMINED OUTPUT STATE IN DROPOUT

BACKGROUND OF THE INVENTION

1. Field of the Invention

The invention is related to integrated circuit comparators and, more particularly, to integrated circuit comparators which operate with relatively low supply voltages.

2. Description of the Related Art

Comparators are used in a wide variety of applications such as squaring circuits, zero crossing detectors, oscillators, and voltage level detectors. Comparators are sometimes described as one-bit analog to digital converters and are important components within analog-to-digital converters of all resolutions. They are also employed within control circuits, to switch on lights and heaters, to control the operation of pumps, and to enable a switching power supply's oscillator. These are just a few of the myriad areas in which comparators find application.

Comparators are, in a first order analysis, simply differential amplifiers with positive feedback. Positive feedback takes the amplifier out of the linear region of operation, and promotes rapid switching from one output state to another. Positive feedback also adds hysteresis to the amplifier, thereby ensuring that the output won't swing wildly from one state to another due to minor noise disturbances at the differential in-puts. For a more detailed description of comparators, see Paul Horowitz, Winfield Hill, *The Art of Electronics*, Cambridge University Press, New York, 1989, Pages 229–231.

FIG.1 illustrates the basic components of a comparator 9. A differential input stage 10 provides inverting and non-inverting inputs (marked − and +, respectively). The differential input stage is composed, primarily, of a balanced differential amplifier 12 that is connected to amplify a differential input signal Vdiff imposed across the comparator's inverting and noninverting inputs. The amplifier 12 provides a gain G1 for amplification of the input signal Vdiff. Since the amplifier 12 is balanced, in a first order analysis, no offset compensation is required, i.e., a differential input signal Vdiff will produce a differential output signal at the output of the differential input stage, Vout= (Vdiff)(G1). However, some comparators include an offset circuit 13, discussed in greater detail in relation to FIG.2, that produces a predetermined comparator output in some circumstances. Unfortunately, the offset circuit 13 creates an input offset that adds an error component to the differential input voltage Vdiff. The output of the differential input stage is connected to an output stage 14 which includes a differential to single-ended converter 16 and a positive feedback circuit 18 which provides the comparator 9 with hysteresis. Although, for convenience, the differential to single-ended converter 16 and positive feedback circuit 18 are drawn separately, they may, in fact, be implemented as a single circuit.

One could also view the positive feedback circuit 18 as a flip-flop, or cross-coupled inverters. To analyze the effect of the comparator's positive feedback, first assume that the output of the comparator is at its "positive rail", Vsat+. A portion of the output voltage is fed back, within the output stage 14 in this example, to effectively produces a variable offset which opposes changes in the comparator's output state. That is, to change the output from Vsat+ to Vsat−, not only must the inverting terminal voltage be greater than that at the noninverting terminal, it must be greater by at least the fedback signal. Similarly, once the output signal has swung to the comparator's negative rail, the voltage at the noninverting terminal must exceed that at the inverting terminal by an amount at least equal to the fedback signal in order to change the comparator's output voltage back to the positive output rail, Vsat+.

In the following illustrative examples, which employ pnp transistors, the transistor control terminals are bases and are labeled bx, one of each transistor's current conduction terminals, the collector, is labeled cx and each transistor's other current conduction terminal, the emitter, is labeled ex. As is known in the art, differential amplifiers may, in alternative implementations employ npn transistors, or n-channel or p-channel FETs, with appropriate substitution of control and conduction terminals.

FIG.2 is a schematic diagram which illustrates the differential input stage 10 in greater detail. The balanced differential amplifier 12 includes a differential pair of transistors Q1, Q2 the bases of which b1 and b2 act as the inverting and noninverting inputs, respectively, of the comparator 9. Emitters e1 and e2 of the transistors Q1 and Q2, respectively, are connected through a bias current source I1 to a positive supply bus V+. Collectors c1 and c2 of the transistors Q1 and Q2 are connected, respectively, through load resistors R1 and R2 to a negative supply bus V− (naturally, either supply bus, V+ or V−, may, under the appropriate circumstances, be referenced to "ground"). The differential output is taken from the collectors c1 and c2. The transistors Q1 and Q2 are matched, that is, they are equal-sized transistors and yield substantially the same collector current for a given base-emitter voltage. Additionally, the resistors R1 and R2 are equal valued resistors.

The gain of the differential amplifier 12 is approximately equal to RC/re, where RC is the collector resistance, given by the value of R1 or R2 and re is the transistors' intrinsic emitter resistance, given by:

re =kT/qIc where:

k=Boltzmann's constant
T=temperature Kelvin
q=the electron charge
Ic=the transistor's collector current Assuming, for example, a temperature of 293 K., a collector current of 10 µA, and 20 k Ω load resistors, the gain of the differential amplifier would be approximately 8. The gain may be adjusted by adjusting the collector current Ic.

As described in the discussion related to FIG.1, the differential output of the differential input stage 10 is coupled to an output stage with hysteresis and, in order to change the output state of a comparator which employs the differential input stage 10, a differential input signal must be of sufficient magnitude to overcome the comparator's built in hysteresis. Although in normal operation this may not seem too daunting a task, in some situations the comparator may fail to operate in this manner. In particular, if the input signal is at one extreme of the comparator's common mode input range, the differential pair 12 may go into dropout, shutting off. That is, if the input signals at the inverting and noninverting inputs are too high to provide sufficient base-emitter voltages for transistors Q1 and Q2, the transistors Q1 and Q2 will turn off. Without the offset circuitry composed of a current source I2, and resistors R3 and R4, whenever the differential amplifier enters dropout the comparator output, because of positive feed-back, would remain in whatever state it was in immediately prior to dropout. The offset circuitry, a current source I2 connected from the positive supply terminal V+ through a resistor divider composed of resistors R3 and R4 to the negative supply terminal V−, produces an offset voltage that forces the comparator output to a predetermined state whenever the differential amplifier 12 enters dropout.

The differential amplifier may enter dropout either because the input signals exceed a specified level or because the comparator's supply voltage drops to a level which does not provide sufficient "headroom" for the input amplifier 12 to operate. Under certain circumstances this could lead to disastrous results. In a control application, for example, whenever the comparator input stage is in dropout, the controlled process may be operating "open loop", or effectively without control. Whether the parameter being controlled is the pressure within a hydrogen tank, the temperature of a greenhouse, or the voltage output of a voltage regulator, allowing the process to run open loop could have costly, and possibly fatal, consequences. Systems which operate from low voltage supplies are particularly susceptible, e.g., as battery voltages fall, to this form of failure.

However, the offset which forces the comparator output to a predetermined state also creates, as mentioned in the discussion related to FIG.1, an offset error signal at the input to the comparator, thus requiring additional compensation circuitry.

SUMMARY OF THE INVENTION

The invention is directed to a comparator that, in addition to "normal operation", i.e. providing an output signal which corresponds to the difference between its inverting and noninverting input terminals, provides a predetermined output whenever its input amplifier enters dropout.

The invention comprises a comparator with unbalanced input amplifiers forming its differential input stage. A first unbalanced input amplifier provides the inverting and non-inverting input terminals and amplifies differential signals applied to those terminals. The differential output of the first amplifier is fed to the differential input of a second unbalanced amplifier, the output of which is converted to a single-ended output with hysteresis. The imbalance in the second differential amplifier is sufficient to drive the output of the comparator to a predetermined state whenever the first differential amplifier is in dropout. The imbalance in the first differential amplifier compensates for the imbalance in the second differential amplifier so that no offset is presented to the signal inputs of the comparator. By imbalancing the differential input amplifiers in this manner, the new comparator not only produces a predetermined output which may be used as a "failsafe", it does so without creating an input offset.

In particular, the new comparator's input stage includes a first differential amplifier which include a differential transistor pair Q1 and Q2 and load resistor resistors R1 and R2. The control terminals of transistors Q1 and Q2 form the new comparator's differential signal inputs. The differential output of the first differential amplifier is connected to the control terminals of the second differential amplifier, which includes a differential pair of transistors Q3 and Q4 and load resistors R3 and R4. The second differential amplifier is unbalanced so that, with zero input voltage, it produces an output voltage of the proper sense and of sufficient magnitude to overcome the variable offset, or hysteresis, voltage of the comparator's output stage. The imbalance of the second differential amplifier may be created by mismatching the load resistors, by mismatching the transistors of the differential pair, i.e., using transistors with different doping profiles and/or different current-control areas, or by a combination of these methods. The first differential amplifier is imbalanced in a compensatory manner so that no input offset voltage is created as a result of the second differential amplifier's imbalance. This is achieved by maintaining the following ratio:

$$(Qd2/Qd1)(RL1/RL2)=(Qd4/Qd3)(RL3/RL4)G2$$

where G2 is the gain of the second differential amplifier, RL1–RL4 are the differential amplifiers' load resistors, and Qd1–Qd4 are, assuming matched doping profiles, the respective transistor areas that control each transistor's current, e.g., a pnp transistor's emitter area. In the preferred embodiment matched transistors are employed, i.e., the transistors are equal-area transistors having the same doping profiles, so the ratio reduces to the special case:

$$(RL1/RL2)=(RL3/RL4)G2.$$

The differential amplifiers may be implemented using pnp, npn, n-channel FET, or p-channel FET transistors.

The novel comparator is particularly suited to control applications. When employed within a burst-mode switching power supply controller, for example, the novel comparator produces an output which disables the controller's oscillator whenever the comparator's first differential amplifier enters dropout. This prevents a burst-mode switching power supply from "running away" whenever dropout occurs.

These and other features, aspects and advantages of the invention will be apparent to those skilled in the art from the following detailed description, taken together with the accompanying drawings.

DETAILED DESCRIPTION OF THE INVENTION

Figure 1:
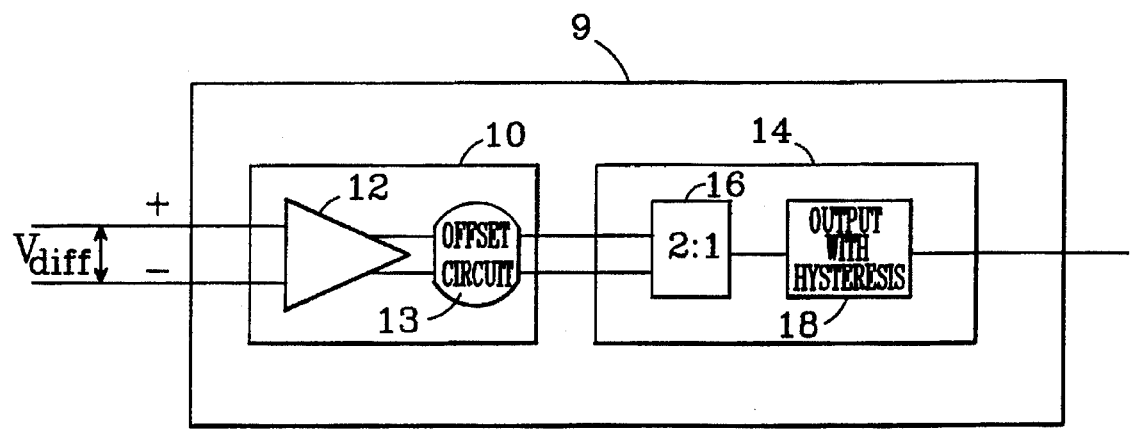
FIG. 1 is a block diagram of a conventional comparator, illustrating the interconnection of the differential input stage, the differential to single-ended converter, and the output stage with hysteresis.

As mentioned in the discussion related to FIG.1, a comparator's input differential amplifier may enter dropout for a number of reasons. Whenever the amplifier's differential inputs too closely approach the comparator's supply voltage, there is insufficient "headroom" for the input differential amplifier to operate and the amplifier's transistors turn off. This may occur when the supply voltage remains fixed and, for some reason, the common mode input varies or it may occur when the supply voltage varies, e.g., when the supply voltage is provided by a source such as a battery, and the supply voltage falls to a level that will not sustain operation with given input signals.

Figure 3:
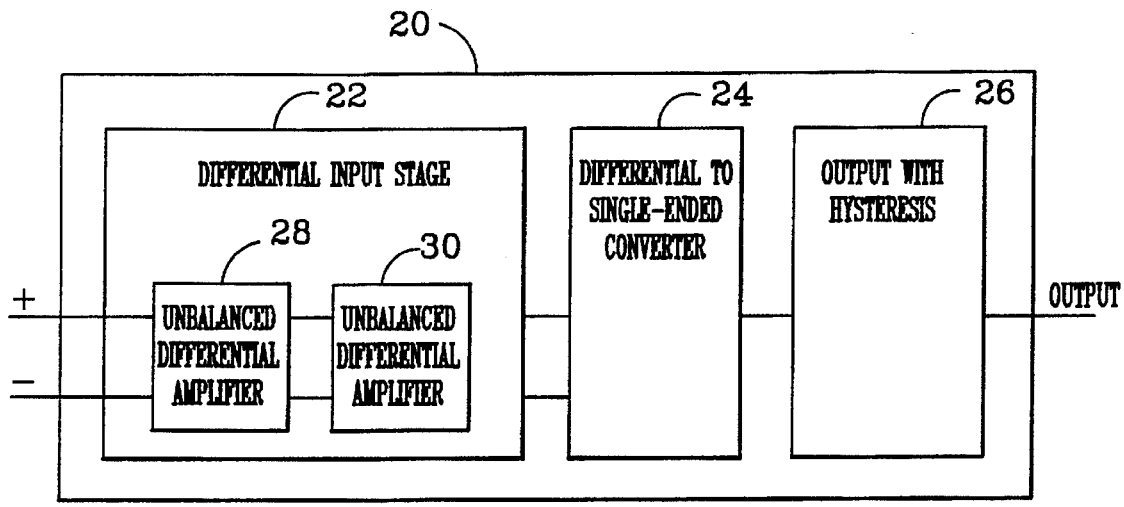
FIG. 3 is a block diagram of the new comparator.

A new comparator 20 of FIG. 3 provides an internal "failsafe" control of its output so that whenever its input differential amplifier enters dropout, the comparator's output goes to a known, predetermined state. The comparator 20 includes a differential input stage 22 which provides inverting (−) and noninverting (+) comparator inputs. The differential input stage 22 provides a differential output signal to a differential-to-single-ended converter 24 which provides a single-ended signal and routes this signal to an output stage 26. The output stage 26 includes positive feedback which, in effect, provides a variable offset that tends to maintain the signal at the OUTPUT terminal in its current state.

Figure 2:
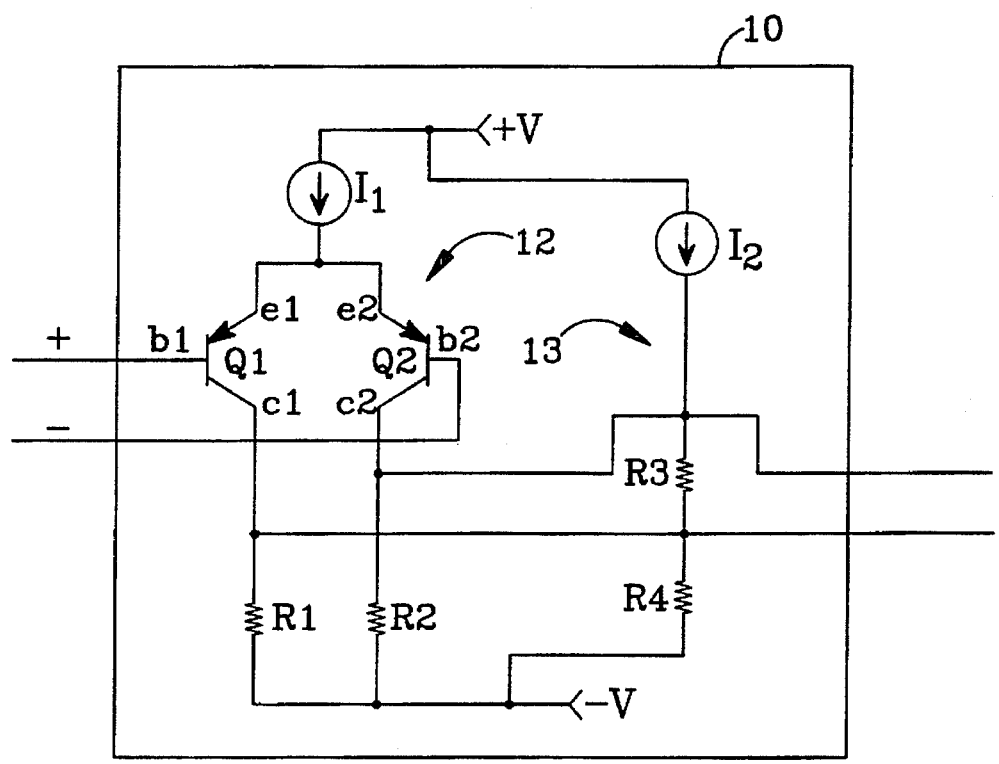
FIG. 2 is a schematic diagram of the differential input stage of the conventional comparator of FIG.1.

The differential input stage 22 includes two unbalanced differential amplifiers. As noted in the discussion related to FIGS. 1 and 2, conventional comparators employ balanced differential amplifiers in their differential input stages. A first unbalanced differential amplifier 28 provides the inverting (−) and noninverting (+) inputs for the comparator 20. A differential input signal presented to the differential amplifier 28 is amplified and passed to a second unbalanced differential amplifier 30. As will be described in greater detail in relation to the discussion of FIG. 4, the imbalances in the differential amplifiers 28 and 30 produce a predetermined signal at the OUTPUT terminal whenever the first differential amplifier 28 enters dropout.

By providing a known signal under these circumstances, any system which employs the comparator 20 may itself enter a failsafe mode of operation which ensures that no critical errors occur during this period of time. For example, if the comparator 20 is employed in a temperature control circuit in which one output state turns a furnace on and the other turns it off, then the failsafe output state from the comparator could be used to turn the furnace off to prevent overheating. On the other hand, if the real danger to the system being controlled involves low temperatures, the comparator's failsafe output state could be used to turn the furnace on.

Figure 4:
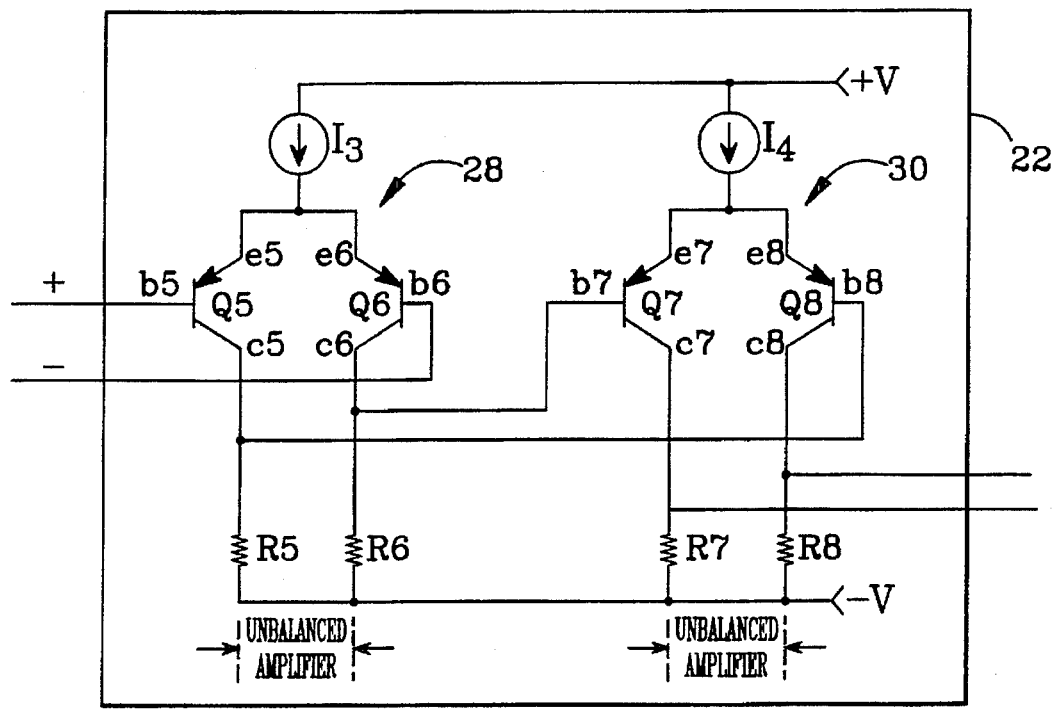
FIGS. 4,5,6, and 7 are schematic diagrams of pnp bipolar, p-channnel FET, npn bipolar and n-channel FET implementations, respectively, of a differential input stage used in the comparator of FIG. 3.

One embodiment of the differential input stage 22 is illustrated in greater detail in the schematic diagram of FIG. 4. Each differential amplifier 28,30 includes a differential pair of bipolar pnp transistors Q5, Q6 and Q7, Q8, respectively. The bases b5 and b6 of the first differential pair 28 act as the inverting and noninverting inputs, respectively, of the comparator 20. Emitters e5 and e6 of the transistors Q5 and Q6, respectively, are connected through a bias current source I3 to a positive supply bus V+. Collectors c5 and c6 of the transistors Q5 and Q6 are connected, respectively, through load resistors R5 and R6 to a negative supply bus V−. Similarly, the bases b7 and b8 of the second differential pair 30 are respectively connected to the collectors c6 and c5 of the first differential pair. Emitters e7 and e8 of the transistors Q7 and Q8 are respectively connected through a bias current source I4 to a positive supply bus V+. Collectors c7 and c8 of the transistors Q7 and Q8 are respectively connected through load resistors R7 and R8 to a negative supply bus V−.

In this embodiment of the novel comparator 20, resistors R5 and R6 are unequal-valued resistors, as are R7 and R8. The inequality of these resistors produces an imbalance in each of the differential amplifiers 28,30. The utility of this imbalance relates to the variable offset voltage which creates the comparator's hysteresis and will be discussed in the context of a low supply voltage forcing the differential amplifier 28 into dropout.

That is, assume for example that the noninverting input of the differential input stage 22 is connected to receive a reference voltage of 1.25 V and the inverting input of the differential input stage 22 is connected to receive a signal fed back from a controlled parameter (biased near 1.25 V). Although the signal appearing at the inverting input may vary slightly, in a first order approximation these signals may be viewed as fixed at approximately 1.25 V. If the positive supply voltage appearing on the V+ bus falls to a level (approximately 2.0 V) that will not support a forward diode drop from the emitters e5,e6 to the bases b5,b6 the transistors Q5 and Q6 will turn off. Consequently the load resistors R5 and R6 will pull the base terminals b7 and b8 to the negative supply voltage V−. If the differential amplifier 30 were balanced, i.e., transistors Q7 and Q8 having the same doping profiles and current-control areas (Q7=Q8) and R7=R8, the comparator output would remain in the same state it was in when the differential amplifier 28 entered dropout. The comparator output state would be left to chance and, in a critical control application, without other precautions the safety of the system would depend upon a coin toss.

The differential amplifier 30 is imbalanced. This imbalance may be achieved by mismatching (using transistors with different doping profiles and/or different current-control areas) the transistors Q7 and Q8, by mismatching the resistors R7 and R8 or by a combination of these methods. In the preferred embodiment the transistors Q7 and Q8 are matched transistors and the resistors R7 and R8 are unequal, with typical resistances of 8.5 kΩ and 13.7 kΩ, respectively. If both bases b7, b8 of the differential amplifier 30 are pulled to the negative supply voltage V−, the transistors Q7 and Q8 will share the current from the bias current source I4 equally. Equal currents through the unequal resistors R7 and R8 produce a differential output voltage at the output of the differential input stage 22. This output voltage is sufficient to overcome the variable offset voltage of the comparator 20 and guarantee that the comparator output will be a predetermined value, VSAT− in the preferred embodiment. That is, if the comparator output is already at VSAT− when the first differential amplifier 28 goes into dropout, it will remain in that state. If the comparator output is at VSAT+ when the first differential amplifier goes into dropout, the differential output created by the mismatched resistors R7 and R8 is greater than the comparator's variable offset voltage, i.e., that created by positive feedback to provide hysteresis, and will force the output of the comparator to switch from VSAT+ to VSAT−.

Given that the resistors R7 and R8 are mismatched in this fashion, an offset voltage is presented to the first differential amplifier 28. In normal operation, i.e., when the first differential amplifier 28 is not in dropout, this offset voltage would be reflected to the differential input of the comparator 20. For this reason, the differential amplifier 28 is also unbalanced and like the differential amplifier 30, this imbalance is created by making the resistors R5 and R6 unequal also: typically 20 kΩ and 16 kΩ in the preferred embodiment. The inequality of these resistors creates a counterbalancing offset so that no fixed offset appears at the differential input of the comparator 20.

To create the "failsafe" differential output from the differential input stage, the resistors R7 and R8 are chosen so that:

$$(\tfrac{1}{2})\,(I4)(R7-R8) > Vh$$

Where:

Vh=the variable offset, or hysteresis voltage

This ensures that the output of the comparator 20 will be forced into a predetermined state whenever the differential input voltage to the second stage equals zero. For a given resistor pair R7, R8 the resistors R5 and R6 are chosen so that:

$$R5/R6=(R7/R8)(1/G2)$$

where G2 is the gain of the second differential amplifier 30, i.e., approximately $(R7+R8)(qI4/2kT)$, assuming that the output stage 23 presents a high input impedance. Reversing these ratios will produce a differential output of the opposite polarity, which could be used to implement a failsafe output from the comparator 20, of the opposite polarity. Additionally, the interconnections between the first differential amplifier 28 and the second 30 could be reversed, with appropriate adjustments in the ratios. For example, if the base b7 were connected to the collector c5 instead of the collector c6 and the base b8 connected to the collector c6 rather than to the collector c5, then the resistors R5 and R6 should be chosen so that $R6/R5=(R7/R8)(1/G2)$.

Figure 5:
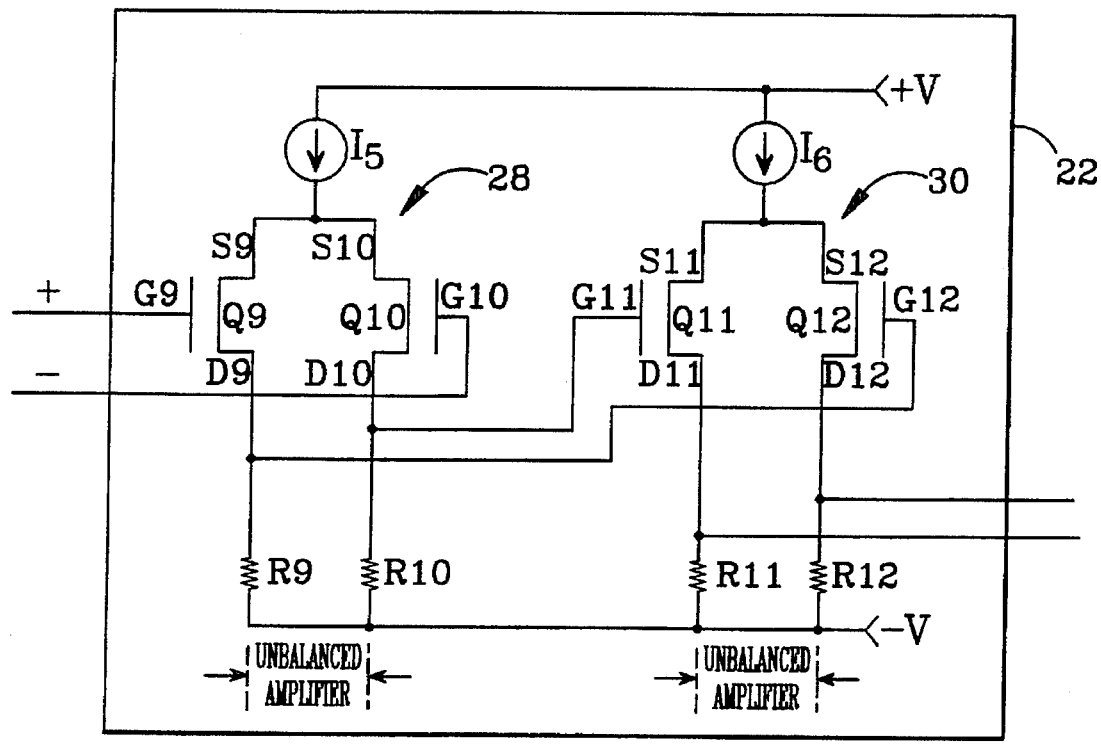

The differential input stage 22 may also be implemented, as illustrated in FIG. 5, with P-channel FETs. Each differential amplifier 28,30 includes a differential pair of transistors Q9, Q10 and Q11,Q12, respectively. The gates, G9 and G10, of the first differential pair 28 act as the inverting and noninverting inputs, respectively, of the comparator 20. Sources s9 and s10 of the transistors Q9 and Q10, respectively, are connected through a bias current source I5 to a positive supply bus V+. Drains d9 and d10 of the transistors Q9 and Q10 are connected, respectively, through load resistors R9 and R10 to a negative supply bus V−. Similarly, the gates G11 and G12 of the second differential pair 30 are respectively connected to the drains d10 and d11 of the first differential pair. Sources s11 and s12 of the transistors Q11 and 12 are respectively connected through a bias current source I6 to a positive supply bus V+. Drains d11 and d12 of the transistors Q11 and Q12 are respectively connected through load resistors R11 and R12 to a negative supply bus V−.

In this embodiment of the novel comparator 20, resistors R9 and R10 are unequal-valued resistors, as are R11 and R12. As described in relation to the discussion of FIG.4, the inequality of these resistors produces an imbalance in each of the differential amplifiers 28,30 with the net effect being that the comparator 20 has a "failsafe" output state and the offset in the differential amplifier 30 is compensated for by the imbalance in the differential amplifier 28.

Figure 6:
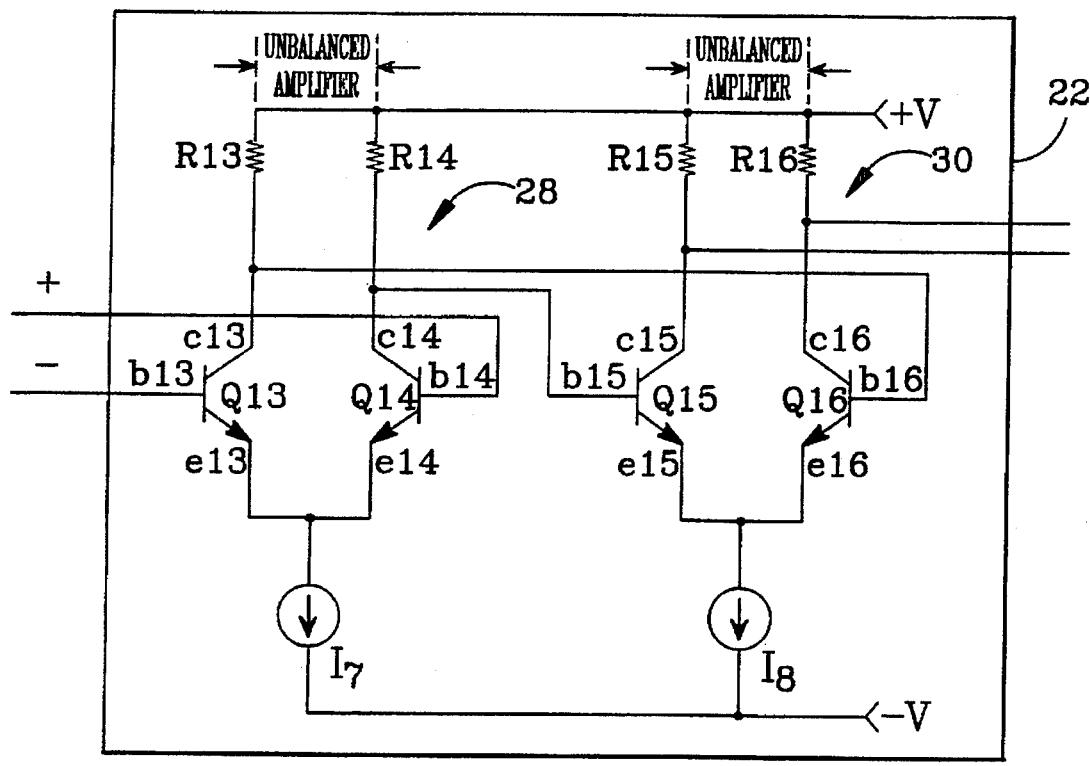

Additionally, the input stage may be implemented, as illustrated in FIG. 6, with npn transistors. Each differential amplifier 28,30 includes a differential pair of transistors Q13, Q14 and Q15,Q16, respectively. The bases, b13 and b14, of the first differential pair 28 act as the inverting and noninverting inputs, respectively, of the comparator 20. Emitters e13 and e14 of the transistors Q13 and Q14, respectively, are connected through a bias current source I7 to a negative supply bus V−. Collectors c13 and c14 of the transistors Q13 and Q14 are connected, respectively, through load resistors R13 and R14 to a positive supply bus V+. Similarly, the bases b15 and b16 of the second differential pair 30 are respectively connected to the collectors c14 and c13 of the first differential pair 28. Emitters e15 and e16 of the transistors Q15 and Q16 are respectively connected through a bias current source I8 to a negative supply bus V−. Collectors c15 and c16 of the transistors Q15 and Q16 are respectively connected through load resistors R15 and R16 to a positive supply bus V+.

In this embodiment of the novel comparator 20, resistors R13 and R14 are unequal-valued resistors, as are R15 and R16. As described in relation to the discussion of FIGS. 4 and 5, the inequality of these resistors produces an imbalance in each of the differential amplifiers 28,30 with the net effect being that the comparator 20 has a failsafe output state and the offset in the differential amplifier 30 is compensated for by the imbalance in the differential amplifier 28.

Figure 7:
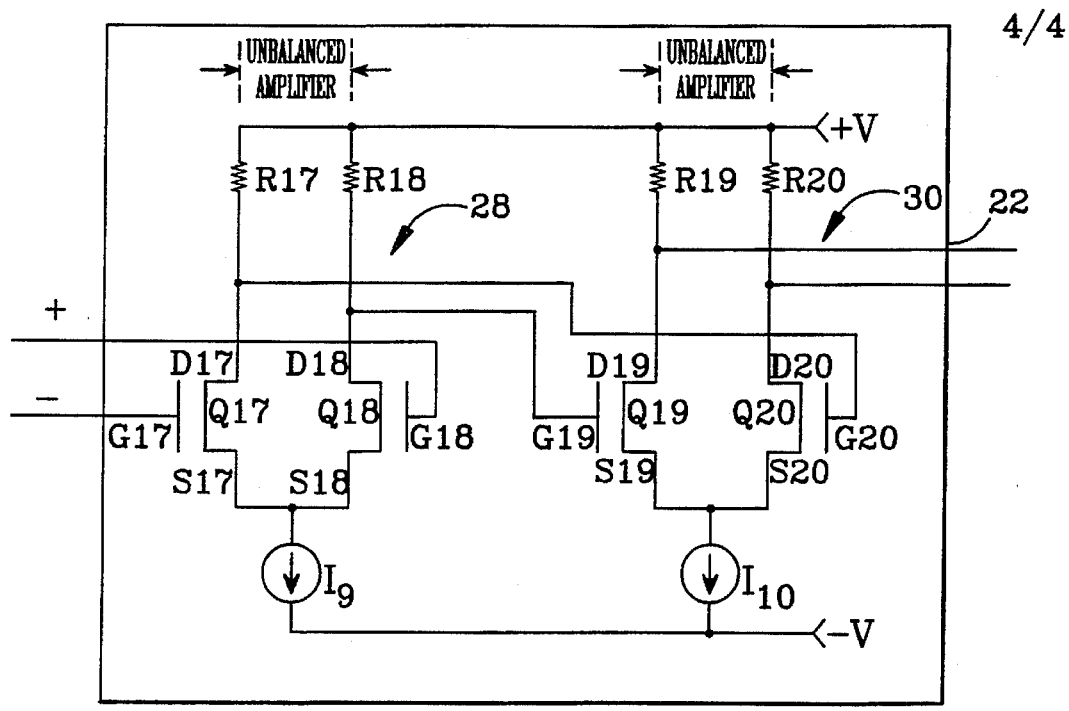

In another implementation, illustrated in FIG.7, the differential input stage 22 includes differential amplifiers 28 and 30 that employ n-channel FETs. Each differential amplifier 28,30 includes a differential pair of transistors Q17, Q18 and Q19, Q20, respectively. The gates, G17 and G18, of the first differential pair 28 act as the inverting and noninverting inputs, respectively, of the comparator 20. Sources s17 and s18 of the transistors Q17 and Q18, respectively, are connected through a bias current source I9 to a negative supply bus V−. Drains d17 and d18 of the transistors Q17 and Q18 are connected, respectively, through load resistors R17 and R18 to a positive supply bus V+. Similarly, the gates G19 and G20 of the second differential pair 30 are respectively connected to the drains d18 and d17 of the first differential pair. Sources s19 and s20 of the transistors Q19 and Q20 are respectively connected through a bias current source I10 to a negative supply bus V−. Drains d19 and d20 of the transistors Q19 and Q20 are respectively connected through load resistors R19 and R20 to a positive supply bus V+.

In this embodiment of the novel comparator 20, resistors R17 and R18 are unequal-valued resistors, as are R19 and R20. This inequality produces the desired imbalance in each of the differential amplifiers 28,30, yielding a comparator 20 with a failsafe output state without an associated input offset voltage.

Figure 8:
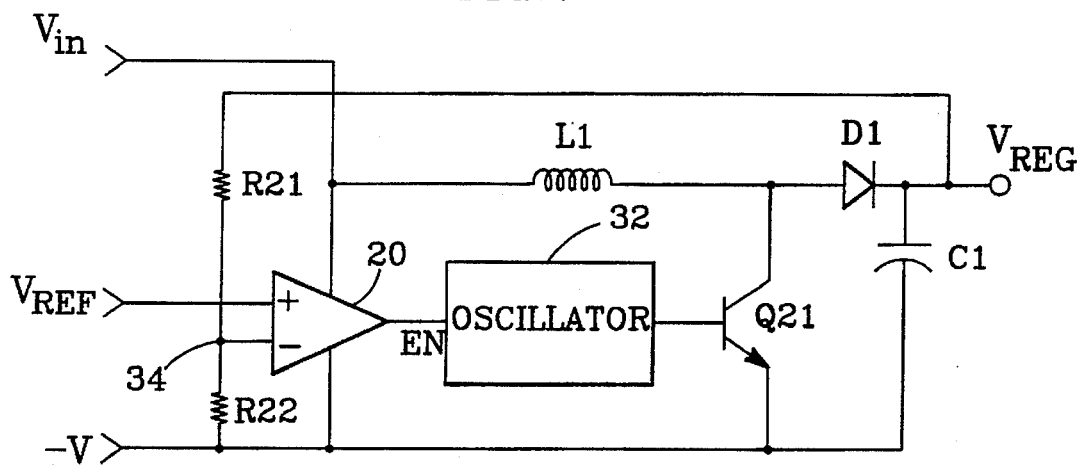
FIG. 8 is a schematic diagram of a burst-mode switching regulator/controller which employs the new comparator in combination with other components to form a novel burst mode switching regulator.

The failsafe output state of the new comparator 20 makes it particularly well-suited to control applications such as the burst-mode switching regulator of FIG.8. Switching regulators are known in the art and provide step-up or step-down, positive or negative regulated voltage outputs from unregulated voltage inputs. For a more detailed description of their operation, see Paul Horowitz, Winfield Hill, *The Art of Electronics*, Cambridge University Press, New York, 1989, Pages 355–368.

The regulator includes a transistor Q21 that, when turned on, establishes a current from an unregulated voltage terminal Vin through an inductor L1 to a return terminal V−. The transistor Q21 is turned off after establishing a current through the inductor L1 in this fashion. The energy stored in the inductor's magnetic field forces the voltage at the anode of a diode D1 higher until the diode is forward-biased, allowing the inductor L1 to charge a capacitor C1 which filters the regulated output Vreg.

An oscillator 32 controls the switching of the transistor Q21. The oscillator 32 is connected through an "enable" input to the output of the new comparator 20, which provides a failsafe output. The comparator derives power from the Vin and V− supply terminals and is connected at its noninverting input to receive a reference voltage Vref. The inverting input of the comparator 20 is connected to the tap 34, of a voltage divider formed by resistors R21 and R22 connected in series between the regulated output terminal Vreg and the negative supply terminal V−. In a preferred embodiment Vin=2.0 V, Vref=1.25 V, Vreg=5.0 V and R21/R22=3. In this illustrative burst-mode regulator, whenever the voltage fed back to the inverting input of the comparator 20 falls below 1.25 V, the comparator's output is HIGH. This HIGH output is fed to the "active HIGH" ENABLE terminal of the oscillator 32, thus enabling the oscillator to switch the transistor Q21 on and off, thereby pumping charge into the capacitor C1 until the voltage across C1 equals the desired regulated output voltage. With the output voltage approximately equal to the desired voltage, the signal fed back to the inverting input of the comparator "trips" the comparator, thereby disabling the oscillator and stopping the previously described switching action.

The comparator's failsafe output can be used to disable the oscillator whenever the unregulated input voltage Vin falls to a level that will, as described in the discussion related to FIG.4, force the comparator's first differential amplifier 28 into dropout.

Figure 9:
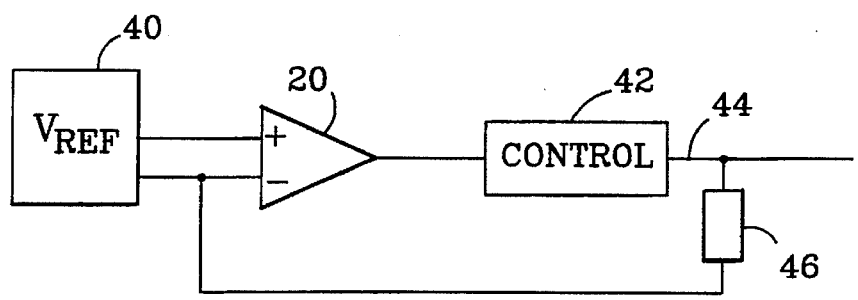
FIG. 9 is a block diagram of a feedback control system which employs the new comparator.

A feedback control system such as depicted in the block diagram of FIG.9 may also employ the new comparator 20. A voltage reference 40 is connected, in this implementation, to the noninverting input (+) of the comparator 20. The output of the comparator is used to drive a control circuit 42 which exercises control over a system parameter that is available for sensing at a terminal 44. A feedback circuit 46 is connected to feed a signal representative of the controlled parameter back to the other, inverting input of the comparator. The controller parameter available at the terminal 44 may be a physical quantity, such as temperature, voltage, or current, etc. and the feedback circuit may be a resistor divider, for example. In fact, a switching regulator such as discussed in relation to FIG.8 may be considered a special case of feedback control system and may be implemented as a buck or boost, inverting or noninverting regulator.

The forgoing description of specific embodiments of the invention has been presented for the purposes of illustration and description. It is not intended to be exhaustive or to limit the invention to the precise forms disclosed, and many modifications and variations are possible in light of the above teachings. For example, although a positive output boost regulator is illustrated, the comparator may be employed by a switching power supply controller to produce a positive or negative output, inverting or noninverting, step-down (buck) or step-up (boost) regulator. The comparator's failsafe output may be implemented as either a positive or negative output and the imbalances in the differential amplifiers may be reversed. The new comparator may also be employed within analog to digital converters.

The embodiments were chosen and described in order to best explain the principles of the invention and its practical application, to thereby enable others skilled in the art to best utilize the invention. It is intended that the scope of the invention be limited only by the claims appended hereto.

We claim:

1. A comparator, comprising:
   a balanced differential input stage including first and second unbalanced differential amplifiers, each having a differential input and a differential output, the input of the first differential amplifier connected to form the comparator input and the output connected to the input of the second differential amplifier, the output of the second differential amplifier connected to provide the output of the input stage, and
   an output stage having hysteresis, said output stage being connected to receive the differential output of the input stage, said input stage connected to force the output of the comparator to a predetermined state whenever the first differential amplifier enters dropout.

2. A comparator, comprising:
   a differential input stage including a plurality of unbalanced differential amplifiers and having noninverting and inverting inputs, substantially zero input offset and a differential output, said differential output connected to produce an offset whenever a part of the differential input stage enters dropout,
   an output stage having hysteresis connected to receive the output of the differential input stage, the offset of the differential input stage being of sufficient magnitude and having the proper sense to force the output of the comparator to a predetermined state, and
   positive and negative supply inputs for said input and output stages.

3. A comparator, comprising:
   positive and negative supply terminals for recieving a supply voltage for the comparator;
   a first unbalanced differential amplifier having an offsert,
   a second unbalanced differential amplifier characterized by a gain and an offset and connected to receive the output of the first unbalanced differential amplifier, the offset of the first differential amplifier equaling the magnitude of the second amplifier offset divided by the gain of the second amplifier, said first amplifier offset also being of opposite polarity to the offset of the second amplifier,
   an output stage having hysteresis connected to receive the output of the second unbalanced differential amplifier, the offset of the second differential amplifier being of sufficient magnitude and forcing the output of the comparator to a predetermined state whenever the supply voltage falls to a level which forces the first unbalanced differential amplifier into dropout.

4. The comparator of claim 3, wherein each differential amplifier comprises:
   a bias current source,
   a pair of load resistors, and
   a differential pair of transistors, each transistor having first and second current conduction terminals and a control terminal, the first current conduction terminal of each transistor connected through said bias current source to one of said voltage supply terminal, the control terminals of said transistors connected to form the comparator's inverting and noninverting inputs, each second current conducting terminal connected through one of said load resistors to the other of said voltage supply terminals.

5. The comparator of claim 4, wherein the second conducting terminals of the first differential pair of transistors are connected to produce the output of the first differential amplifier.

6. The comparator of claim 5, wherein the control terminals of the second differential pair of transistors are connected to form the input terminals of the second differential amplifier and the second current conducting terminals of the second differential pair of transistors are connected to produce the differential input stage output.

7. The comparator of claim 6, wherein emitter areas of the transistors and the load resistors of the first differential amplifier form a product (Qd2/Qd1)(RL1/RL2) that is unequal to one, emitter areas of the transistors and the load resistors of the second differential amplifier form a product (Qd4/Qd3) (RL3/RL4) and $$(Qd2/Qd1) (RL1/RL2) = (Qd4/Qd3) (RL3/RL4)/G2$$

where G2 is the gain of the second differential amplifier Qd1–Qd4 are the emitter areas of the differential amplifiers' transistors, and RL1–RL4 are the values of the differential amplifiers' load resistors.

8. The comparator of claim 6, wherein the load resistors of the first differential pair form a ratio RL1/RL2, where RL1/RL2 is unequal to one, the resistors of the second differential pair form a ratio RL3/RL4, and the ratio of RL1/RL2 equals (1/G2) (RL3/RL4), where G2 is the gain of the second differential amplifier and RL1–RL4 are the values of the load resistors.

9. The comparator of claim 7, wherein said transistors are pnp bipolar transistors.

10. The comparator of claim 7, wherein said transistors are npn bipolar transistors.

11. The comparator of claim 7, wherein said transistors are p-channel FETs.

12. The comparator of claim 7, wherein said transistors are n-channel FETs.

13. A feedback control system, comprising:
   a comparator, comprising:
      inverting and noninverting signal inputs,
      an output,
      positive and negative supply terminals, for receiving a supply voltage for the comparator,
      a first unbalanced differential amplifier having an offset,
      a second unbalanced differential amplifier characterized by a gain and an offset and connected to receive the output of the first unbalanced differential amplifier, the offset of the first differential amplifier equaling the magnitude of the second amplifier offset divided by the gain of the second amplifier, said first amplifier offset also being of opposite polarity to the offset of the second amplifier, and
      an output stage having hysteresis connected to receive the output of the second unbalanced differential amplifier, the offset of the second differential amplifier being of sufficient magnitude and forcing the output of the comparator to a predetermined state whenever the supply voltage falls to a level which forces the first unbalanced differential amplifier into dropout,
   a voltage reference connected to provide an input signal to one of the signal inputs of the comparator,
   a feedback circuit connected to feed a signal representative of a controlled parameter back to the other comparator signal input, and
   a control circuit connected to control a parameter within the system based upon the state of the comparator's output.

14. A burst-mode switching regulator controller, comprising:
   a comparator, comprising:
      inverting and noninverting signal inputs,
      an output,
      positive and negative supply terminals, for recieving a supply voltage for the comparator;
      a first unbalanced differential amplifier having an offset,
      a second unbalanced differential amplifier characterized by a gain and an offset and connected to receive the output of the first unbalanced differential amplifier, the offset of the first differential amplifier equaling the magnitude of the second amplifier offset divided by the gain of the second amplifier, said first amplifier offset also being of opposite polarity to the offset of the second amplifier, and
      an output stage having hysteresis connected to receive the output of the second unbalanced differential amplifier, the offset of the second differential amplifier being of sufficient magnitude and forcing the output of the comparator to a predetermined state whenever the supply voltage falls to a level which forces the first unbalanced differential amplifier into dropout,
   a voltage reference connected to provide an input signal to one of the signal input terminals of the comparator,
   a feedback circuit connected to a regulated voltage terminal and to provide a signal representative of a voltage at the regulated voltage terminal to the other input terminal of the comparator, and
   an oscillator connected to produce an oscillating output under control of the output of said comparator to control a switch that is connected to the regulated voltage terminal.

15. A burst-mode switching voltage regulator, comprising:
   a comparator, comprising:
      inverting and noninverting signal inputs,
      an output,
      positive and negative supply terminals for receiving a supply voltage for the comparator,
      a first unbalanced differential amplifier having an offset,
      a second unbalanced differential amplifier characterized by a gain and an offset and connected to receive the output of the first unbalanced differential amplifier, the offset of the first differential amplifier equaling the magnitude of the second amplifier offset divided by the gain of the second amplifier, said first amplifier offset also being of opposite polarity to the offset of the second amplifier, and
      an output stage having hysteresis connected to receive the output of the second unbalanced differential amplifier, the offset of the second differential amplifier being of sufficient magnitude and forcing the output of the comparator to a predetermined state whenever the supply voltage falls to a level which forces the first unbalanced differential amplifier into dropout,
   a voltage reference connected to provide an input signal to one of the signal input terminals of the comparator,
   a feedback circuit connected to a regulated voltage terminal and to provide a signal representative of a voltage at the regulated voltage terminal to the other input terminal of the comparator,
   an oscillator connected to produce an oscillating output under control of the comparator output, and
   a switch connected at a control terminal to the oscillator output and through its current conducting terminals to establish a current through an inductor, said inductor coupled to charge a capacitor and to thereby produce a regulated output voltage at the regulated voltage terminal.

16. The regulator of claim 15, wherein said regulator is an inverting regulator.

17. The regulator of claim 15, wherein said regulator is a noninverting regulator.

18. The regulator of claim 15, wherein said regulator is a boost regulator.

19. The regulator of claim 15, wherein said regulator is a buck regulator.

* * * * *